United States Patent
Ding et al.

(10) Patent No.: US 11,189,646 B2
(45) Date of Patent: Nov. 30, 2021

(54) DISPLAY SUBSTRATE INCLUDING SIGNAL LINE ELECTRICALLY CONNECTED TO CONDUCTIVE PATTERN THROUGH THE PLURALITY OF VIA HOLES

(71) Applicant: BOE Technology Group Co., Ltd., Beijing (CN)

(72) Inventors: Luke Ding, Beijing (CN); Jingang Fang, Beijing (CN); Bin Zhou, Beijing (CN); Ning Liu, Beijing (CN); Guangyao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 28 days.

(21) Appl. No.: 16/580,320

(22) Filed: Sep. 24, 2019

(65) Prior Publication Data
US 2020/0105793 A1 Apr. 2, 2020

(30) Foreign Application Priority Data
Sep. 27, 2018 (CN) .......................... 201811133538.4

(51) Int. Cl.
*H01L 27/12* (2006.01)
*H01L 21/027* (2006.01)
*H01L 49/02* (2006.01)
*H01L 29/786* (2006.01)

(52) U.S. Cl.
CPC ........ *H01L 27/124* (2013.01); *H01L 21/0274* (2013.01); *H01L 27/127* (2013.01); *H01L 27/1218* (2013.01); *H01L 27/1248* (2013.01); *H01L 27/1255* (2013.01); *H01L 27/1288* (2013.01); *H01L 28/60* (2013.01); *H01L 29/78633* (2013.01)

(58) Field of Classification Search
CPC ............... H01L 27/124; H01L 27/1255; H01L 27/14812; H01L 27/322; H01L 27/3248
See application file for complete search history.

(56) References Cited

U.S. PATENT DOCUMENTS

| 2015/0318305 | A1 | 11/2015 | Zhang et al. |
| 2018/0114796 | A1 | 4/2018 | Jiang et al. |
| 2018/0122882 | A1* | 5/2018 | Lee ..................... H01L 27/3258 |

FOREIGN PATENT DOCUMENTS

| CN | 103296033 A | 9/2013 |
| CN | 103824876 A | 5/2014 |
| CN | 105448935 A | 3/2016 |

(Continued)

OTHER PUBLICATIONS

First office action of Chinese application No. 201811133538.4 dated Mar. 27, 2020.

*Primary Examiner* — Hoai V Pham
(74) *Attorney, Agent, or Firm* — Fay Sharpe LLP

(57) ABSTRACT

A display substrate, a method for manufacturing the same, and a display device are disclosed. The display substrate includes: a base substrate; and a conductive pattern, a first insulating layer and a conductive layer laminated on the base substrate, wherein the first insulating layer has a plurality of first via holes, and the conductive layer includes a signal line, the signal line being electrically connected to the conductive pattern through the plurality of first via holes. The present disclosure may achieve efficient transmission of signals and ensure the display effect of the display device.

18 Claims, 16 Drawing Sheets

(56) References Cited

FOREIGN PATENT DOCUMENTS

| CN | 108281468 A | 7/2018 |
|---|---|---|
| JP | 2010102237 A | 5/2010 |
| KR | 20060098075 A | 9/2006 |

* cited by examiner

DISPLAY SUBSTRATE INCLUDING SIGNAL LINE ELECTRICALLY CONNECTED TO CONDUCTIVE PATTERN THROUGH THE PLURALITY OF VIA HOLES

CROSS-REFERENCE TO RELATED APPLICATION

This application claims priority to Chinese Patent Application No. 201811133538.4, filed on Sep. 27, 2018 and entitled "DISPLAY SUBSTRATE, METHOD FOR MANUFACTURING SAME, AND DISPLAY DEVICE", the entire contents of which are incorporated herein by reference.

TECHNICAL FIELD

The present disclosure relates to a display substrate, a method for manufacturing same, and a display device.

BACKGROUND

The display substrate in the display device generally includes a plurality of signal lines, and a plurality of pixel units arranged in an array. The signal lines may transmit signals for the pixel units. With the development of display technology, high-resolution display devices have received extensive attention, but their display effects still need to be improved.

SUMMARY

Embodiments of the present disclosure provide a display substrate, a method for manufacturing the same, and a display device. The technical solutions are as follows:

In an aspect, a display substrate is provided. The display substrate includes: a base substrate; and a conductive pattern, a first insulating layer, and a conductive layer laminated on the base substrate, wherein the first insulating layer has a plurality of first via holes, and the conductive layer includes a signal line electrically connected to the conductive pattern through the plurality of first via holes.

Optionally, an overlap exists between an orthographic projection of the signal line on the base substrate and an orthographic projection of the conductive pattern on the base substrate.

Optionally, the conductive pattern is a strip-shaped pattern, and a lengthwise direction of the conductive pattern is parallel to a lengthwise direction of the signal line.

Optionally, the display substrate further includes: an active layer pattern, wherein the conductive pattern is distributed in the same layer as the active layer pattern.

Optionally, an orthographic projection of the active layer pattern on the base substrate does not overlap with the orthographic projection of the conductive pattern on the base substrate.

Optionally, the display substrate further includes: a second insulating layer and a gate pattern, wherein the active layer pattern, the second insulating layer, the gate pattern, the first insulating layer and the conductive layer are sequentially distributed in a direction distal from the base substrate, the conductive layer further includes a source-drain pattern, and the first insulating layer further has a second via hole, the source-drain pattern being electrically connected to the active layer pattern through the second via hole.

Optionally, the display substrate further includes: a light-shielding layer disposed on a side of the active layer pattern proximal to the base substrate, and a buffer layer disposed between the light-shielding layer and the active layer pattern, wherein the light-shielding layer includes a light-shielding pattern, and an orthographic projection of the light-shielding pattern on the base substrate covers the orthographic projection of the active layer pattern on the base substrate; wherein the first insulating layer and the buffer layer each have a third via hole, the third via hole on the first insulating layer is communicated with the third via hole on the buffer layer, and the source-drain pattern is electrically connected to the light-shielding pattern through the communicated third via holes.

Optionally, the display substrate further includes: a passivation layer, a color film layer, a planar layer, and an electrode layer sequentially laminated on a side of the conductive layer distal from the base substrate, wherein the electrode layer includes an electrode pattern, and the passivation layer and the planar layer each have a communicated electrode via hole, the electrode pattern being electrically connected to the source-drain pattern through the electrode via holes; and the light-shielding layer further includes a first electrode plate, the conductive layer further includes a second electrode plate, and the electrode layer further includes a third electrode plate, the first electrode plate, the second electrode plate and the third electrode plate constituting a storage capacitor.

Optionally, the display substrate further includes: a second insulating layer and a source-drain pattern, wherein the active layer pattern, the first insulating layer, the conductive layer, the second insulating layer and the source-drain pattern are sequentially distributed in a direction distal from the base substrate, the conductive layer further includes a gate pattern, the second insulating layer has a second via hole, and the source-drain pattern is electrically connected to the active layer pattern through the second via hole.

Optionally, the display substrate further includes: a light-shielding layer disposed on a side of the active layer pattern proximal to the base substrate, and a buffer layer disposed between the light-shielding layer and the active layer pattern, wherein the light-shielding layer includes a light-shielding pattern, and an orthographic projection of the light-shielding pattern on the base substrate covers the orthographic projection of the active layer pattern on the base substrate; and the second insulating layer and the buffer layer each have a third via hole, the third via hole on the second insulating layer is communicated with the third via hole on the buffer layer, and the source-drain pattern is electrically connected to the light-shielding pattern through the communicated third via holes.

Optionally, the display substrate further includes: a passivation layer, a color film layer, a planar layer, and an electrode layer sequentially laminated on a side of the conductive layer distal from the base substrate, wherein the electrode layer includes an electrode pattern, the passivation layer and the planar layer each have a communicated electrode via hole, and the electrode pattern is electrically connected to the source-drain pattern through the electrode via holes; and the light-shielding layer further includes a first electrode plate, the display substrate further includes a second electrode plate, and the electrode layer further includes a third electrode plate, and the first electrode plate, the second electrode plate and the third electrode plate constituting a storage capacitor.

In another aspect, a method for manufacturing a display substrate is provided. The method includes: forming a conductive pattern, a first insulating layer and a conductive layer laminated on a base substrate, wherein the first insulating layer has a plurality of first via holes, and the conductive layer includes a signal line, the signal line being electrically connected to the conductive pattern passing through the plurality of first via holes.

Optionally, the conductive pattern is a strip-shaped pattern, and a lengthwise direction of the conductive pattern is parallel to a lengthwise direction of the signal line.

Optionally, the display substrate further includes: an active layer pattern, the conductive pattern being distributed in the same layer as the active layer pattern, and forming a conductive pattern on the base substrate includes: depositing a semiconductor film on the base substrate; coating a photoresist on a side of the semiconductor film distal from the base substrate; patterning the photoresist to obtain a first photoresist pattern and a second photoresist pattern, the first photoresist pattern having a thickness smaller than a thickness of the second photoresist pattern; etching the semiconductor film with the first photoresist pattern and the second photoresist pattern as a mask; removing the first photoresist pattern and thinning the second photoresist pattern; conductorizing a portion of the semiconductor film after etching that is not covered by the second photoresist pattern to obtain the conductive pattern; and removing the second photoresist pattern to obtain the active layer pattern.

Optionally, removing the first photoresist pattern and thinning the second photoresist pattern includes: ashing the first photoresist pattern and the second photoresist pattern to remove the first photoresist pattern and thin the second photoresist pattern.

Optionally, performing conducting treatment on a portion of the semiconductor film after etching that is not covered by the second photoresist pattern to obtain the conductive pattern includes: performing ion doping on a portion of the semiconductor film after etching that is not covered by the second photoresist pattern to obtain the conductive pattern.

Optionally, the patterning the photoresist includes: exposing the photoresist with a halftone mask; and developing the exposed photoresist.

Optionally, prior to the forming an active layer pattern on the base substrate, the method further includes: sequentially forming a light-shielding layer and a buffer layer on the base substrate, wherein the light-shielding layer includes a light-shielding pattern and a first electrode plate, and the buffer layer has a third via hole; forming an active layer pattern on the base substrate includes: forming an active layer pattern on a side of the buffer layer distal from the base substrate, wherein an orthographic projection of the light-shielding pattern on the base substrate covers an orthographic projection of the active layer pattern on the base substrate; upon the forming an active layer pattern on a side of the buffer layer distal from the base substrate, the method further includes: forming a second insulating layer and a gate pattern on a side of the active layer pattern distal from the base substrate; forming a first insulating layer and a conductive layer on the base substrate includes: sequentially forming the first insulating layer and the conductive layer on a side of the gate pattern distal from the base substrate, wherein the conductive layer further includes a source-drain pattern and a second electrode plate, and the first insulating layer further has a second via hole and a third via hole, the third via hole on the first insulating layer being communicated with the third via hole on the buffer layer, the source-drain pattern being electrically connected to the active layer pattern through the second via hole, and the source-drain pattern being electrically connected to the light-shielding pattern through the communicated third via hole; upon the sequentially forming the first insulating layer and the conductive layer on a side of the gate pattern distal from the base substrate, the method further includes: sequentially forming a passivation layer, a color film layer, a planar layer and an electrode layer on a side of the conductive layer distal from the base substrate, wherein the electrode layer includes an electrode pattern and a third electrode plate, and the passivation layer and the planar layer each have a communicated electrode via hole, the electrode pattern being electrically connected to the source-drain pattern through the electrode via holes; wherein the first electrode plate, the second electrode plate and the third electrode plate constitute a storage capacitor.

Optionally, prior to forming an active layer pattern on the base substrate, the method further includes: sequentially forming a light-shielding layer and a buffer layer on the base substrate, wherein the light-shielding layer includes a light-shielding pattern and a first electrode plate, and the buffer layer has a third via hole; forming an active layer pattern on the base substrate includes: forming an active layer pattern on a side of the buffer layer distal from the base substrate, wherein an orthographic projection of the light-shielding pattern on the base substrate covers an orthographic projection of the active layer pattern on the base substrate; forming a first insulating layer and a conductive layer on the base substrate includes: sequentially forming the first insulating layer and the conductive layer on a side of the active layer pattern distal from the base substrate, wherein the conductive layer further includes a gate pattern; after sequentially forming the first insulating layer and the conductive layer on a side of the active layer pattern distal from the base substrate, the method further includes: forming a second insulating layer and a source-drain pattern on a side of the conductive layer distal from the base substrate, and a second electrode plate distributed in the same layer as the source-drain pattern, wherein the second insulating layer has a second via hole and a third via hole, the third via hole on the second insulating layer being communicated with the third via hole on the buffer layer, the source-drain pattern being electrically connected to the active layer pattern through the second via hole, and the source-drain pattern being electrically connected to the light-shielding pattern through the communicated third via holes; and sequentially forming a passivation layer, a color film layer, a planar layer and an electrode layer on a side of the source-drain pattern distal from the base substrate, wherein the electrode layer includes an electrode pattern and a third electrode plate, and the passivation layer and the planar layer each have a communicated electrode via hole, the electrode pattern being electrically connected to the source-drain pattern through the electrode via holes; wherein the first electrode plate, the second electrode plate and the third electrode plate constitute a storage capacitor.

In still another aspect, a display device is provided. The display device includes the display substrate according to the above aspect.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure is described in further detail with reference to the accompanying drawings, to present the objects, technical solutions, and advantages of the present disclosure more clearly.

The display substrate in the display device generally includes a plurality of signal lines and a plurality of pixel units. The signal lines may transmit signals for the pixel units. As known to the inventors, in a display device having a higher resolution, for an increase of the number of pixel units, the width of the signal line is usually small, and as a result, the signal line is easily broken. Further, if the film layer in contact with the signal line is not planar, the signal line needs to be formed on the surface of the film layer having a slope, and the portion of the signal line disposed at the slope is easily broken. The signal line being broken causes the signal to be unable to be transmitted to the pixel unit, and the display device has a poor display effect.

Figure 1:
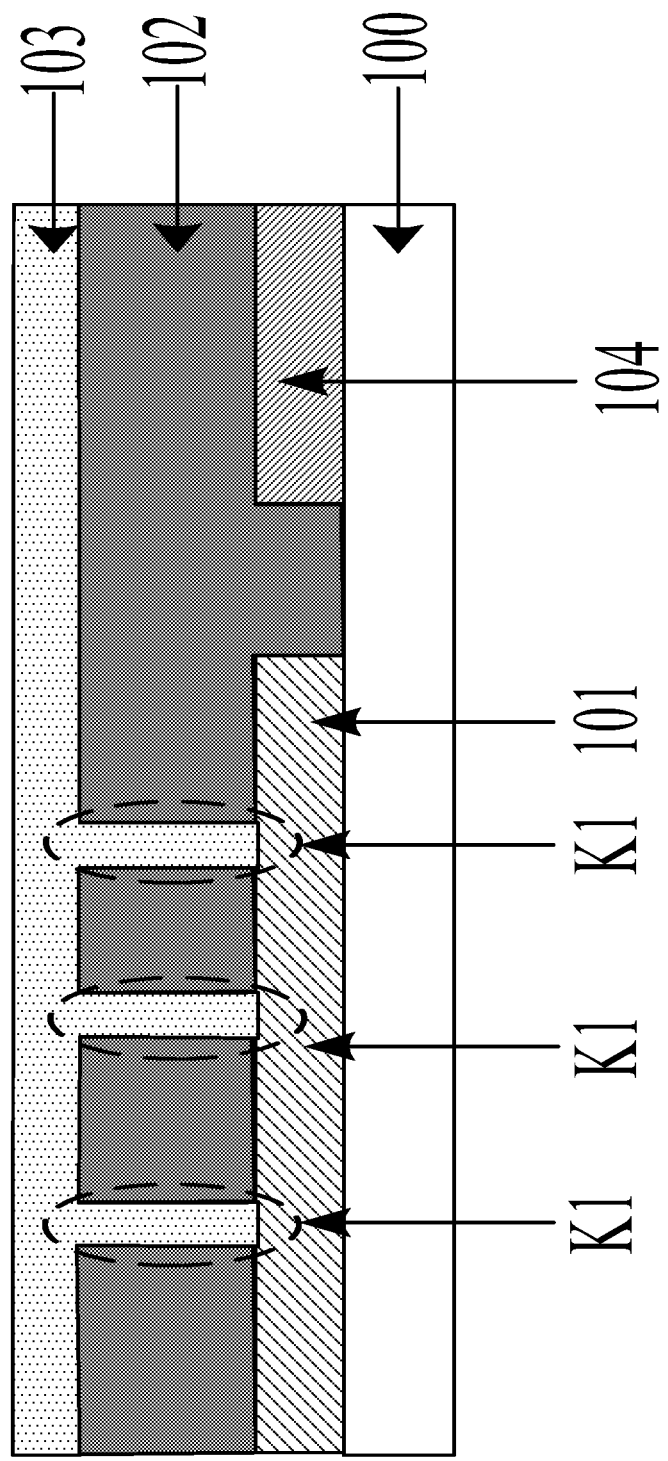
FIG. 1 is a schematic structural diagram of a display substrate according to an embodiment of the present disclosure.

FIG. 1 is a schematic structural diagram of a display substrate according to an embodiment of the present disclosure. As shown in FIG. 1, the display substrate may include a base substrate 100, and a conductive pattern 101, a first insulating layer 102, and a conductive layer (not shown in FIG. 1) laminated on the base substrate 100. The first insulating layer 102 has a plurality of first via holes K1. The conductive layer includes a signal line 103. The signal line 103 is electrically connected to a conductive pattern 103 through the plurality of first via holes K1. FIG. 1 is exemplified by having three first via holes K1 on the first insulating layer 102.

In summary, an embodiment of the present disclosure provides a display substrate, in which the signal line in the conductive layer is electrically connected to the conductive pattern through the plurality of first via holes on the first insulating layer. Therefore, if a portion of the signal line between two first via holes is broken, the signal in the signal line may be transmitted to the pixel unit through the conductive pattern between the two first via holes, thereby achieving efficient transmission of the signal and ensuring the display effect of the display device.

In the embodiment of the present disclosure, since the signal line is electrically connected to the conductive pattern through the plurality of first via holes on the first insulating layer, the signal line is connected in parallel to the conductive pattern. The conductive pattern may reduce the resistance of the signal line, which facilitates the transmission of signals in the signal line and improves the display effect of the display device.

Optionally, an overlap exists between an orthographic projection of the signal line 103 on the base substrate 100 and an orthographic projection of the conductive pattern 101 on the base substrate 100. For example, the orthographic projection of the signal line 103 on the base substrate 100 is disposed within the orthographic projection of the conductive pattern 101 on the base substrate 100. Optionally, as shown in FIG. 2, the orthographic projection of the signal line 103 on the base substrate 100 coincides with the orthographic projection of the conductive pattern 101 on the base substrate 100.

Optionally, the conductive pattern 101 may be a strip pattern. A lengthwise direction of the conductive pattern 101 may be parallel to a lengthwise direction of the signal line 103, such that the signal line 103 may be electrically connected to the conductive pattern 101 through the plurality of first via holes K1. If a portion of the signal line 103 between any two of the first via holes K1 is broken, the signal in the signal line 103 may be transmitted to the pixel unit across the broken portion through the conductive pattern 101 between the any two first via holes K1, thereby achieving efficient transmission of signals and ensuring the display effect of the display device.

Optionally, referring to FIG. 1, the display substrate further includes an active layer pattern 104. The conductive pattern 101 is distributed in the same layer as the active layer pattern 104. An orthographic projection of the active layer pattern 104 on the base substrate 101 does not overlap with the orthographic projection of the conductive pattern 101 on the base substrate 100. That is, the active layer pattern 104 is not in direct contact with the conductive pattern 101. The active layer pattern 104 and the conductive pattern 101 may be prepared by the same patterning process. The display substrate may include a thin film transistor (TFT). The active layer pattern 104 may serve as a channel of the TFT in the display substrate.

Figure 2:
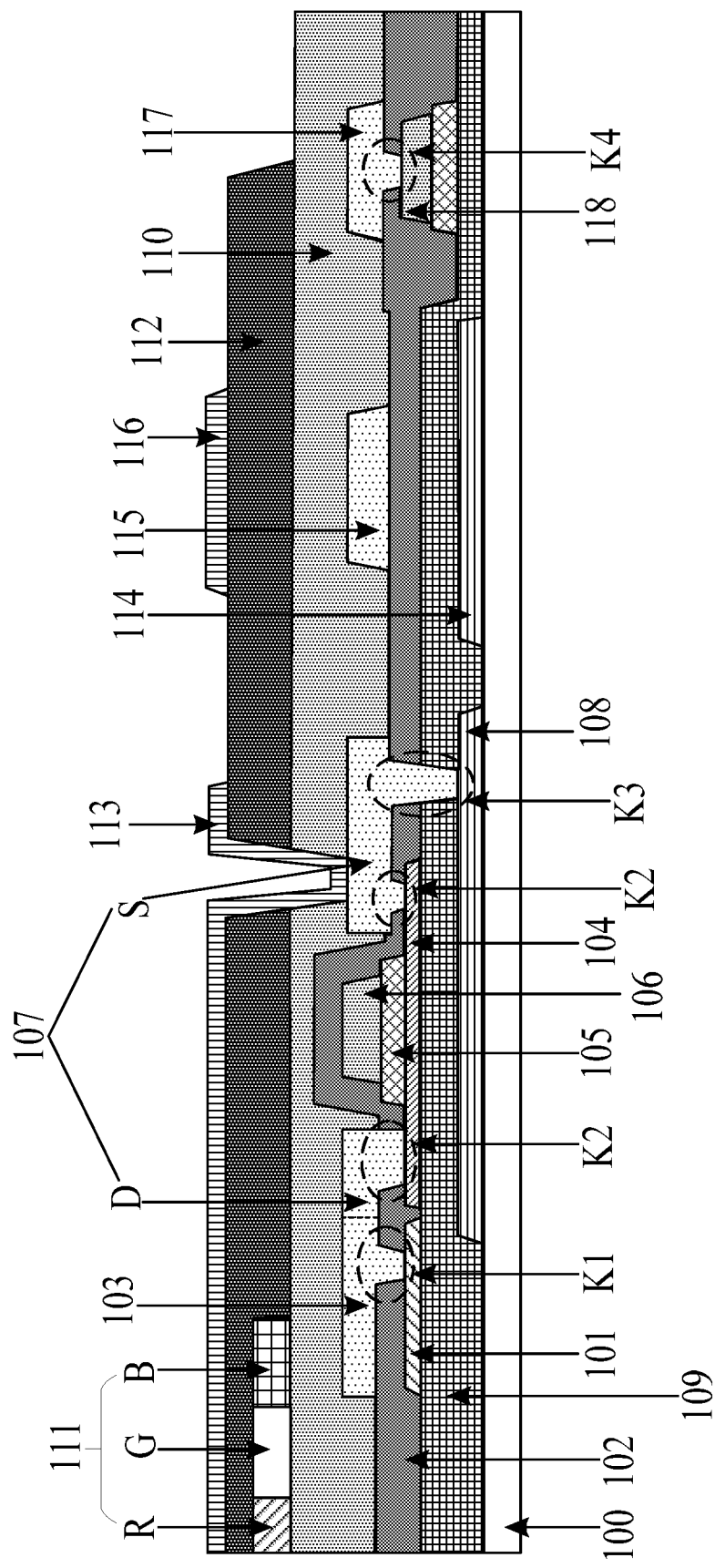
FIG. 2 is a schematic structural diagram of another display substrate according to an embodiment of the present disclosure.

FIG. 2 is a schematic structural diagram of another display substrate according to an embodiment of the present disclosure. As an alternative implementation, as shown in FIG. 2, on the basis of the structure shown in FIG. 1, the display substrate further includes a second insulating layer 105 and a gate pattern 106. The active layer pattern 104, the second insulating layer 105, the gate pattern 106, the first insulating layer 102, and the conductive layer are sequentially distributed in a direction distal from the base substrate 101. The conductive layer may further include a source-drain pattern 107. The first insulating layer 102 may further have a second via hole K2. The source-drain pattern 107 may be electrically connected to the active layer pattern 104 through the second via hole K2. The source-drain pattern 107 may include a source S and a drain D. The second via hole K2 on the first insulating layer 102 may include a source via hole and a drain via hole. The source S may be electrically connected to the active layer pattern 104 through the source via hole. The drain D may be electrically connected to the active layer pattern 104 through the drain via hole. A person skilled in the art would easily understand that, in the display substrate shown in FIG. 2, the first insulating layer 102 may be an interlayer dielectric (ILD) layer, the second insulating layer 105 may be a gate insulating (GI) layer, the signal line 103 is distributed in the same layer as the source-drain pattern 107, the signal line 103 may be electrically connected to the source-drain pattern 107, and the signal line 103 may be integrally formed with the source-drain pattern 107. The signal line 103 may be a data (DATA) line or a high level power (VDD) line.

Optionally, referring to FIG. 2, the display substrate may further include a light-shielding layer (not shown in FIG. 2) disposed on a side of the active layer pattern 104 proximal to the base substrate 100. The light-shielding layer may include a light-shielding pattern 108. An orthographic projection of the light-shielding pattern 108 on the base substrate 100 may cover the orthographic projection of the active layer pattern 104 on the base substrate 100, such that the light-shielding pattern 108 may shield the active layer pattern 104 from light to prevent external light from entering the active layer pattern 104. As shown in FIG. 2, the first insulating layer 102 further has a third via hole K3. The source-drain pattern 107 is electrically connected to the light-shielding pattern 108 through the third via hole K3. Optionally, the source S is electrically connected to the light-shielding pattern 108 through the third via hole K3. In the embodiment of the present disclosure, the source-drain pattern 107 is electrically connected to the light-shielding pattern 108 through the third via hole K3. Therefore, the source-drain pattern 107 is connected in parallel to the light-shielding pattern 108. The light-shielding pattern 108 may reduce the resistance of the source-drain pattern 107, which improves the display effect of the display device.

Optionally, referring to FIG. 2, the display substrate may further include a buffer layer 109 disposed between the light-shielding layer and the active layer pattern 104. The buffer layer 109 has a third via hole. The third via hole K3 on the first insulating layer 102 is communicated with the third via hole on the buffer layer 109. The source-drain pattern 107 is electrically connected to the light-shielding pattern 108 through the communicated third via holes on the first insulating layer 102 and the buffer layer 109.

Optionally, referring to FIG. 2, the display substrate further includes a passivation layer 110, a color film layer 111, a planar layer 112, and an electrode layer (not shown in FIG. 2) which are sequentially laminated on a side of the conductive layer 103 distal from the base substrate 101. The color film layer 111 may include a red color film R, a green color film G and a blue color film B. The color film layer 111 may filter the pixel unit. The electrode layer includes an electrode pattern 113. The passivation layer 110 and the planar layer 112 each have a communicated electrode via hole (not shown in FIG. 2) through which the electrode pattern 113 is electrically connected to the source-drain pattern 107, The electrode pattern 113 may be a pixel electrode. When the display substrate is an organic light-emitting diode (OLED) display substrate, the electrode pattern 113 may be an anode. As shown in FIG. 2, the light-shielding layer may further include a first electrode plate 114. The conductive layer 103 may further include a second electrode plate 115. The electrode layer may further include a third electrode plate 116. The orthographic projections of the first electrode plate 114, the second electrode plate 115 and the third electrode plate 116 on the base substrate 100 may overlap. The first electrode plate 114, the second electrode plate 115, and the third electrode plate 116 constitute a storage capacitor. It is easily understood that the capacitor has a three-layer structure.

Optionally, referring to FIG. 2, the conductive layer may further include a first signal trace 117. The display substrate may further include a second signal trace 118 distributed in the same layer as the gate pattern 106. The first insulating layer 102 further has a fourth via hole K4. The first signal trace 117 may be electrically connected to the second signal trace 118 through the fourth via hole K4. Each of the first signal trace 117 and the second signal trace 118 may be a peripheral trace of the display substrate. For example, each of the first signal trace 117 and the second signal trace 118 may be a ground line of the display substrate, etc., which is not limited in the embodiment of the present disclosure.

Figure 3:
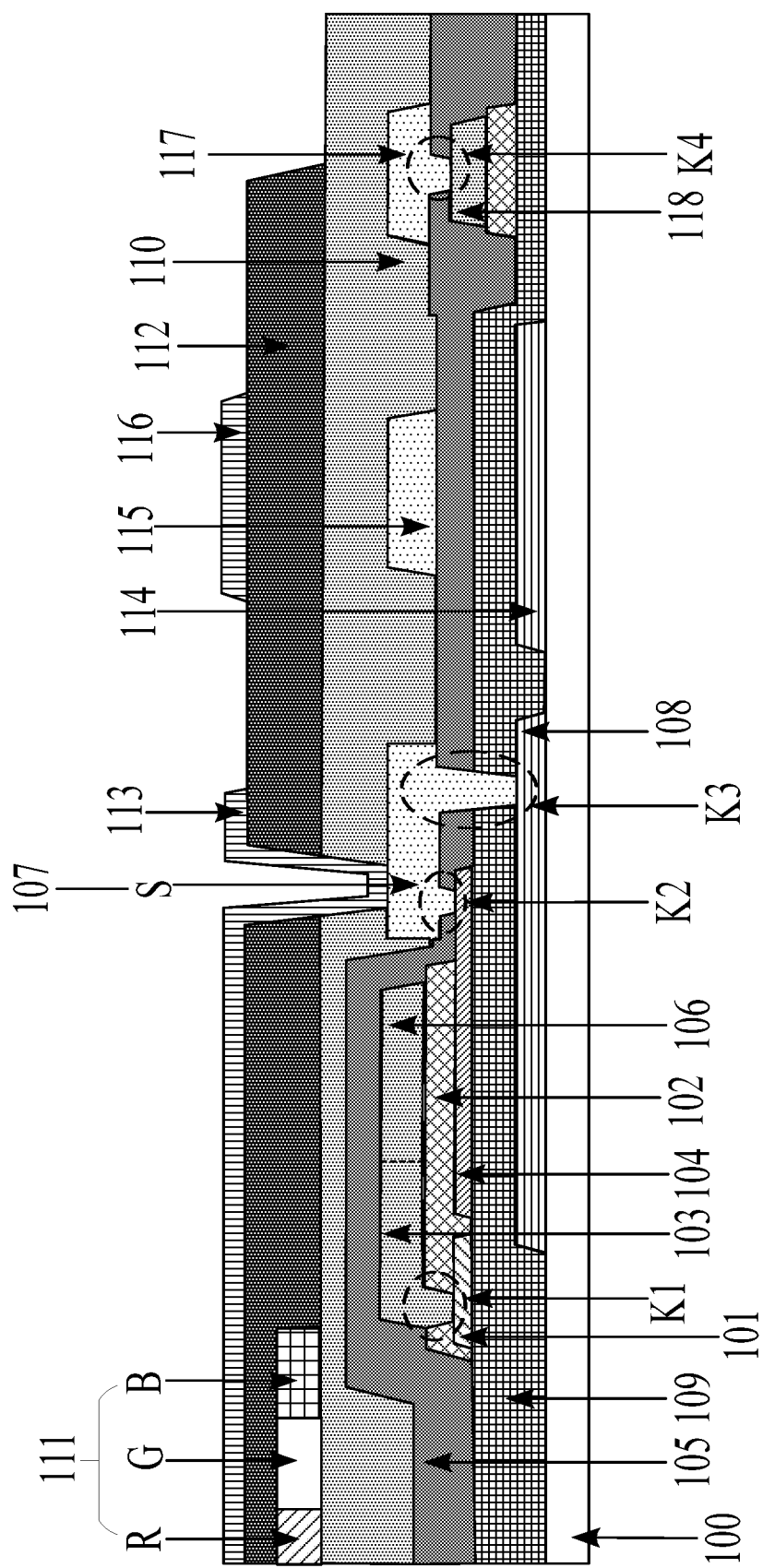
FIG. 3 is a schematic structural diagram of still another display substrate according to an embodiment of the present disclosure.

FIG. 3 is a schematic structural diagram of still another display substrate according to an embodiment of the present disclosure. As another alternative implementation, as shown in FIG. 3, on the basis of the structure shown in FIG. 1, the display substrate further includes a second insulating layer 105 and a source-drain pattern 107. The active layer pattern 104, the first insulating layer 102, the conductive layer, the second insulating layer 105, and the source-drain pattern 107 are sequentially distributed in a direction distal from the base substrate 100. The conductive layer may further include a gate pattern 106. The second insulating layer 105 has a second via hole K2. The source-drain pattern 107 is electrically connected to the active layer pattern 104 through the second via hole K2. The source-drain pattern 107 includes a source S and a drain (not shown in FIG. 3). The source S is electrically connected to the active layer pattern 104 through the second via hole K2. A person skilled in the art would easily understand that in the display substrate shown in FIG. 3, the first insulating layer 102 may be a GI layer, the second insulating layer 105 may be an ILD layer, the signal line 103 is distributed in the same layer as the gate pattern 106, the signal line 103 may be electrically connected to the gate pattern 106, the signal line 103 may be integrally formed with the gate pattern 106, and the signal line 103 may be a gate line or a reset signal line or the like.

Optionally, referring to FIG. 3, similarly to FIG. 2, the display substrate may further include a light-shielding layer (not shown in FIG. 3) disposed on a side of the active layer pattern 104 proximal to the base substrate 100. The light-shielding layer may include a light-shielding pattern 108. An orthographic projection of the light-shielding pattern 108 on the base substrate 100 may cover the orthographic projection of the active layer pattern 104 on the base substrate 100. As shown in FIG. 3, the second insulating layer 105 has a third via hole K3. The source-drain pattern 107 is electrically connected to the light-shielding pattern 108 through the third via hole K3.

Optionally, referring to FIG. 3, the display substrate may further include a buffer layer 109 disposed between the light-shielding layer and the active layer pattern 104. The buffer layer 109 has a third via hole. The third via hole K3 on the second insulating layer 105 is communicated with the third via hole on the buffer layer 109. The source-drain pattern 107 is electrically connected to the light-shielding pattern 108 through the communicated third via holes on the second insulating layer 105 and the buffer layer 109.

Optionally, referring to FIG. 3, the display substrate may further include a passivation layer 110, a color film layer 111, a planar layer 112, and an electrode layer (not shown in FIG. 3) which are sequentially laminated on a side of the conductive layer distal from the base substrate 100. The color film layer 111 may include a red color film R, a green color film G, and a blue color film 13. The electrode layer may include an electrode pattern 113. The passivation layer 110 and the planar layer 112 each have a communicated electrode via hole (not shown in FIG. 3) through which the electrode pattern 113 may be electrically connected to the source-drain pattern 107.

Optionally, referring to FIG. 3, similarly to FIG. 2, the light-shielding layer further includes a first electrode plate 114. The display substrate further includes a second electrode plate 115 distributed in the same layer as the source-drain pattern 107. The electrode layer further includes a third electrode plate 116. The first electrode plate 114, the second electrode plate 115, and the third electrode plate 116 constitute a storage capacitor. The conductive layer may further include a second signal trace 118. The display substrate may further include a first signal trace 117 distributed in the same layer as the source-drain pattern 107. The second insulating layer 105 further has a fourth via hole K4. The first signal trace 117 may be electrically connected to the second signal trace 118 through the fourth via hole K4.

It may be understood that the TFT in the display substrate may be a top gate type TFT or a bottom gate type TFT. In the display substrates of FIGS. 2 and 3, the active layer pattern 104, the GI layer, the gate pattern 106, the ILD layer and the source-drain pattern 107 constitute a TFT. FIG. 2 and FIG. 3 are exemplified by a TFT as a top-gate TFT. Of course, the TFT in the display substrate according to the embodiment of the present disclosure may be a bottom-gate TFT. When the TFT in the display substrate may be a bottom gate type TFT, the gate pattern 106 may be disposed on a side of the active layer pattern 104 proximal to the base substrate 100. The position of the signal line in the conductive layer and the connection relationship between the signal line and the conductive pattern may be made reference to the related description of the embodiments shown in FIG. 2 and FIG. 3, and details are not described herein again. In addition, each pixel unit of the display substrate has one pixel circuit. The pixel circuit generally includes a plurality of (for example, three) TFTs. The source-drain patterns of different TFTs may be connected to different types of signal lines, and the gate patterns of different TFTs may be connected to different types of signal lines, which is not limited in the embodiment of the present disclosure.

It may be understood that the display substrates shown in FIGS. 1 to 3 are merely exemplary and shall not be used to display the actual structure of the display substrate. An actual display substrate may include more or less structures than FIG. 1 to FIG. 3. For example, when the display substrate is an OLED display substrate, the display substrate may further include a structure such as a light-emitting layer and a cathode, which is not described herein.

In summary, the embodiment of the present disclosure provides a display substrate, in which the signal line of the conductive layer is electrically connected to the conductive pattern through the plurality of first via holes on the first insulating layer. Therefore, if a portion of the signal line between two first via holes is broken, the signal in the signal line may be transmitted to the pixel unit through the conductive pattern between the two first via holes, thereby achieving efficient transmission of the signal and ensuring the display effect of the display device.

A method for manufacturing a display substrate according to an embodiment of the present disclosure may be used to manufacture the display substrate as shown in any one of FIG. 1 to FIG. 3, the method may include:

forming a conductive pattern, a first insulating layer and a conductive layer laminated on a base substrate, wherein the first insulating layer has a plurality of first via holes, the conductive layer includes a signal line, and the signal line is connected to the conductive pattern through the plurality of first via holes.

Optionally, the display substrate may further include an active layer pattern. The conductive pattern is distributed in the same layer as the active layer pattern. The conductive pattern and the active layer pattern may be prepared by the same patterning process.

Figure 4:
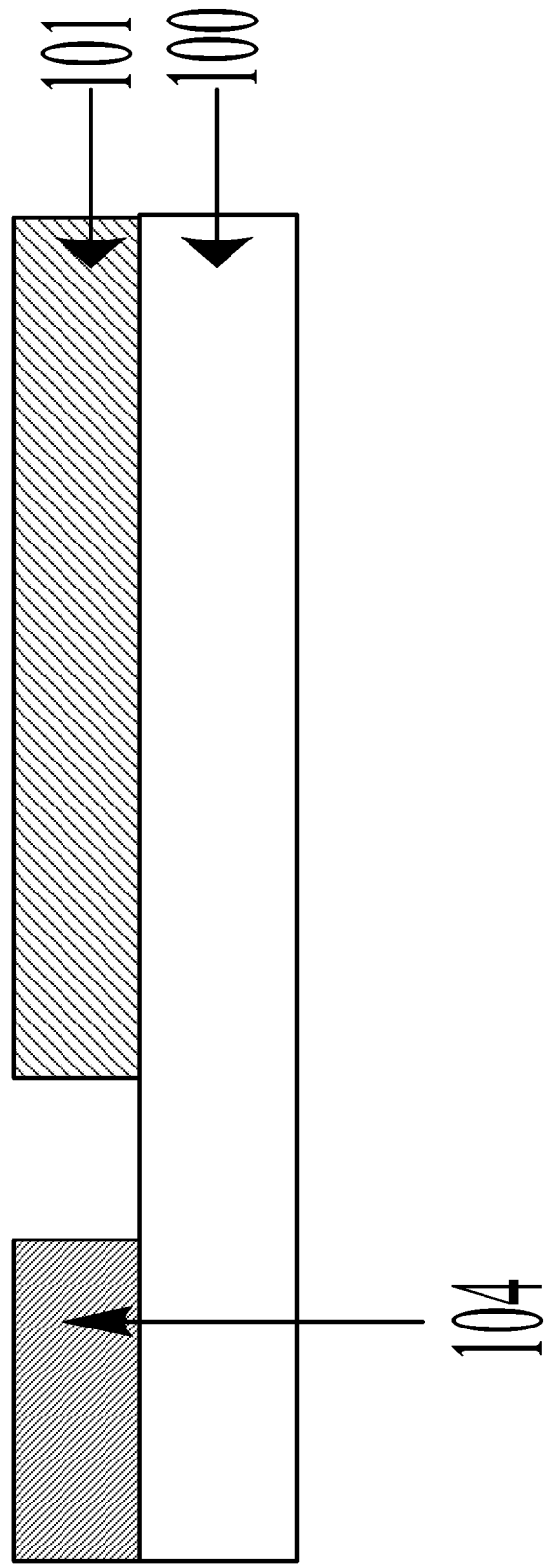
FIG. 4 is a schematic diagram of a substrate formed with a conductive pattern and an active layer pattern according to an embodiment of the present disclosure.
Figure 5:
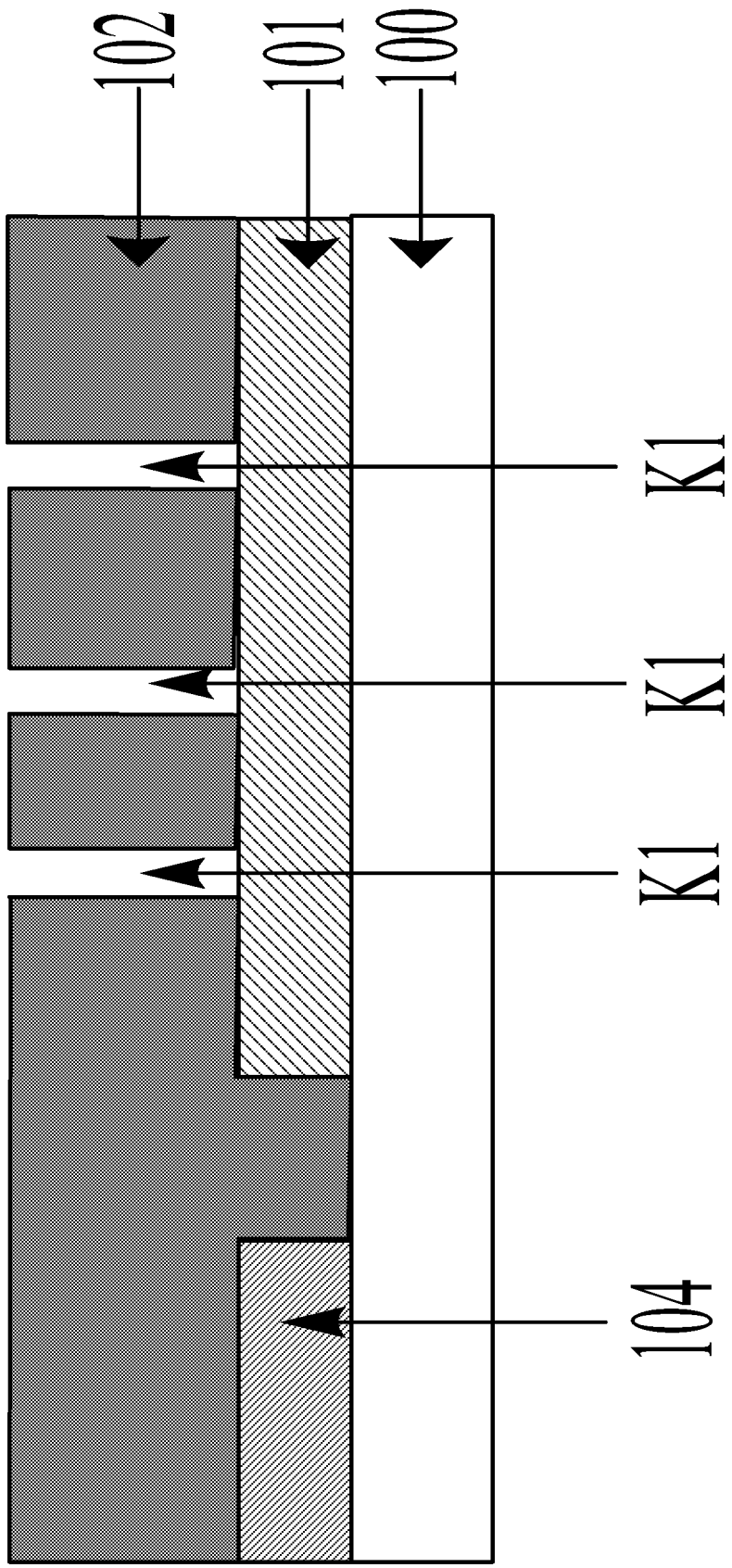
FIG. 5 is a schematic diagram of a substrate formed with an insulating layer according to an embodiment of the present disclosure.

Optionally, the conductive pattern, the first insulating layer and the conductive layer laminated, and the active layer pattern distributed in the same layer as the conductive pattern may be sequentially formed on the base substrate by a plurality of patterning processes. The active layer pattern may be made from a semiconductor material, and the conductive pattern may be a made from conductive semiconductor material. For example, the active layer pattern 104 may be made from P—Si, and the conductive pattern may be made from conductorized P—Si. The first insulating layer may be made from silica. The conductive layer may be made from copper or aluminum. A schematic diagram of a base substrate formed with a conductive pattern and an active layer pattern may be referred to FIG. 4. A schematic diagram of a base substrate formed with a first insulating layer may be referred to FIG. 5. A schematic diagram of a base substrate formed with a conductive layer may be referred to FIG. 1.

In summary, an embodiment of the present disclosure provides a method for manufacturing a display substrate. In the display substrate manufactured by the method, the signal line of the conductive layer is connected to the conductive pattern through the plurality of first via holes on the first insulating layer. Therefore, if a portion of the signal line between two first via holes is broken, the signal in the signal line may also be transmitted to the pixel unit across the broken portion through the conductive pattern between the two first via holes, thereby achieving efficient transmission of the signal and ensuring the display effect of the display device.

Figure 6:
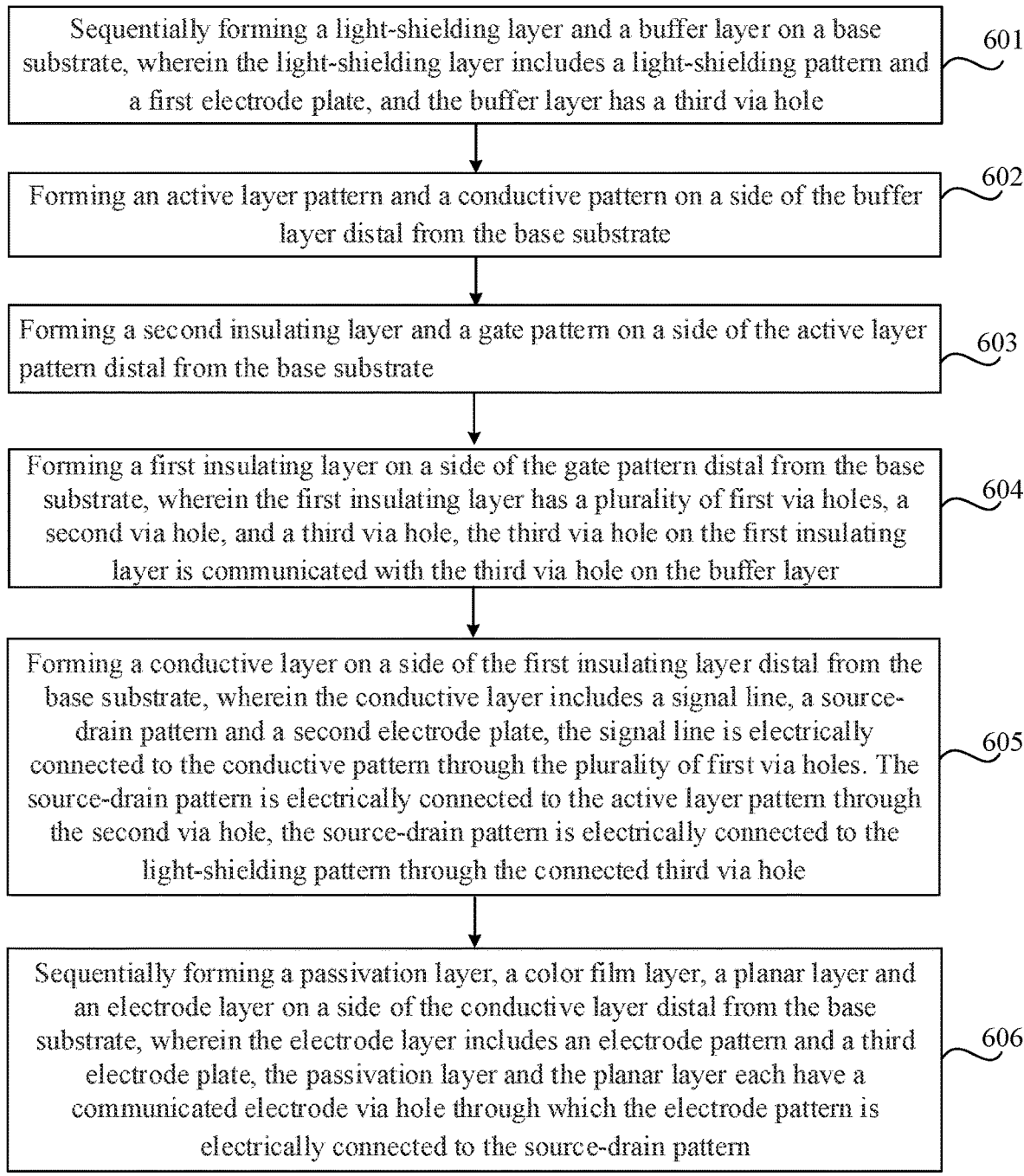
FIG. 6 is a flowchart of a method for manufacturing a display substrate according to an embodiment of the present disclosure.

FIG. 6 is a flowchart of a method for manufacturing a display substrate according to an embodiment of the present disclosure. FIG. 6 illustrates the method for manufacturing a display substrate by using the display substrate shown in FIG. 2 as an example. The method for manufacturing a display substrate shown in FIG. 3 may be referred to this embodiment. Referring to FIG. 6, the method may include the following steps.

In step 601, a light-shielding layer and a buffer layer are sequentially formed on a base substrate. The light-shielding layer includes a light-shielding pattern and a first electrode plate. The buffer layer has a third via hole.

Figure 7:
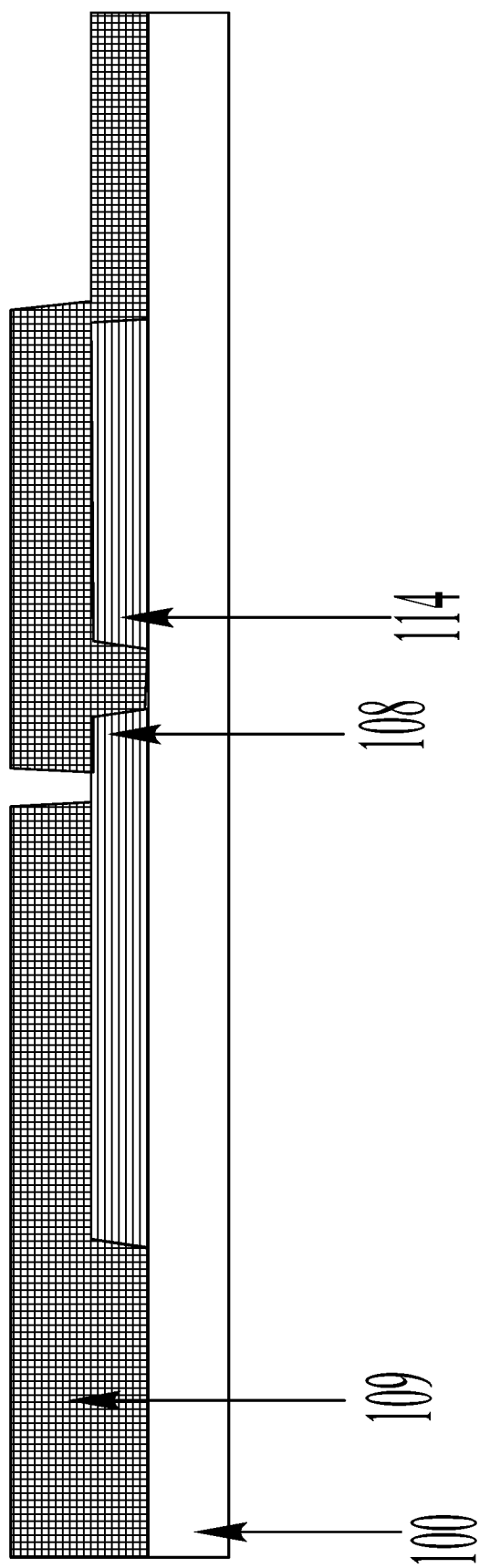
FIG. 7 is a schematic diagram of a light-shielding layer and a buffer layer formed on a base substrate according to an embodiment of the present disclosure.

FIG. 7 is a schematic diagram of a light-shielding layer and a buffer layer 109 formed on a base substrate 100 according to an embodiment of the present disclosure. The light-shielding layer may include a light-shielding pattern 108 and a first electrode plate 114, The buffer layer 109 has a third via hole (not shown in FIG. 7). The light-shielding layer may be made from a metal material, and the buffer layer 109 may be made from silica. Optionally, first, the light-shielding layer is formed on the base substrate 100 by one-time patterning process, and then the buffer layer 109 is formed on a side of the light-shielding layer distal from the base substrate 100 by one-time patterning process.

In step 602, an active layer pattern and a conductive pattern are formed on a side of the buffer layer distal from the base substrate.

Figure 8:
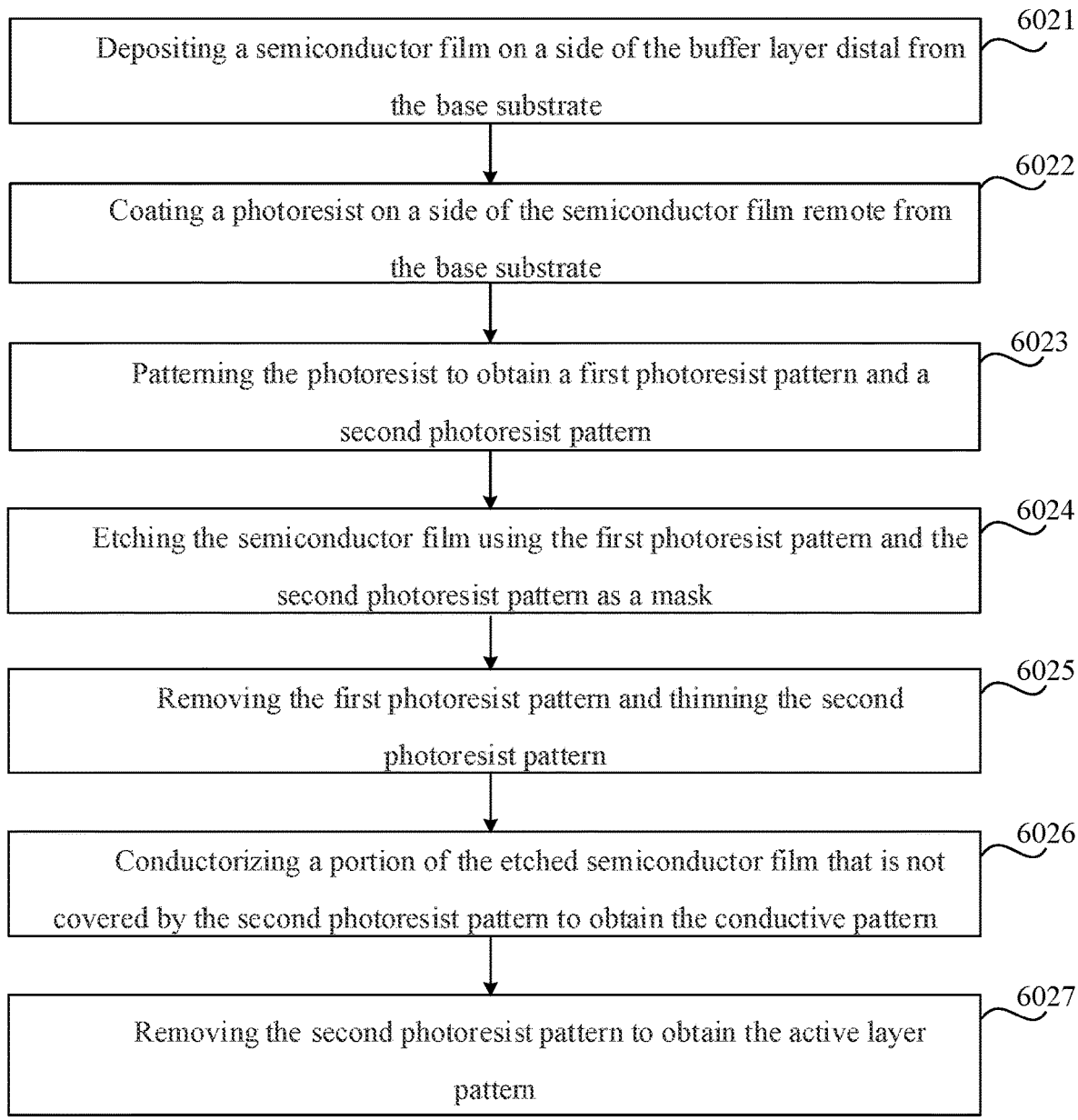
FIG. 8 is a flow chart of forming an active layer pattern and a conductive pattern on a side of a buffer layer distal from a base substrate according to an embodiment of the present disclosure.

Optionally, FIG. 8 is a flowchart of forming an active layer pattern and a conductive pattern on a side of a buffer layer distal from a base substrate according to an embodiment of the present disclosure. Referring to FIG. 8, the method may include the following sub-step.

In sub-step 6021, a semiconductor film is deposited on a side of the buffer layer distal from the base substrate.

Figure 9:
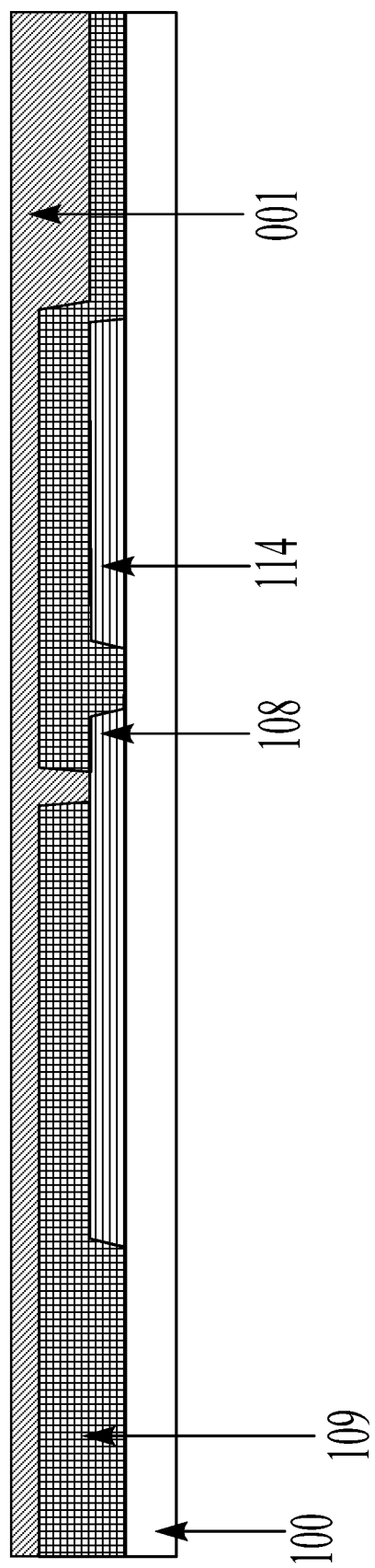
FIG. 9 is a schematic diagram of a semiconductor film formed on a side of a buffer layer distal from a base substrate according to an embodiment of the present disclosure.

FIG. 9 is a schematic diagram of a semiconductor film 001 deposited on a side of the buffer layer 109 distal from the base substrate 100 according to an embodiment of the present disclosure. The semiconductor film 001 may be made from P—Si.

In sub-step 6022, a photoresist is coated on a side of the semiconductor film remote from the base substrate.

Figure 10:
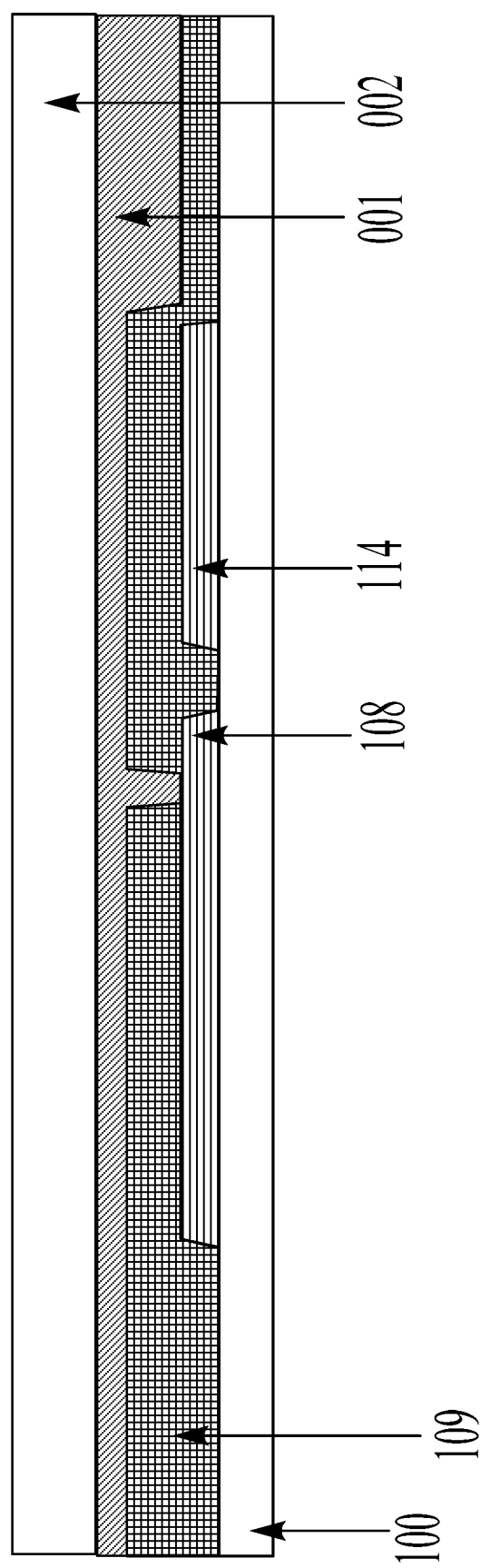
FIG. 10 is a schematic diagram of a photoresist coated on a semiconductor film according to an embodiment of the present disclosure.

FIG. 10 is a schematic diagram of a photoresist 002 coated on a side of the semiconductor film 001 distal from the base substrate 100, which may be a positive photoresist.

In sub-step 6023, the photoresist is patterned to obtain a first photoresist pattern and a second photoresist pattern.

Figure 11:
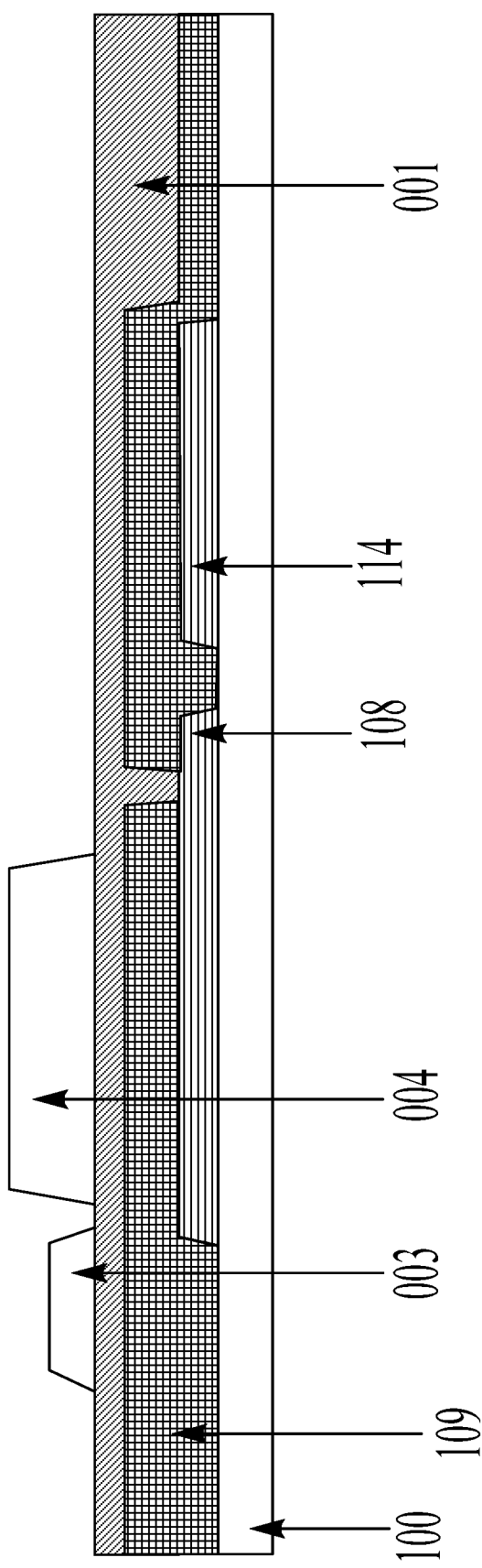
FIG. 11 is a schematic diagram of a photoresist patterned according to an embodiment of the present disclosure.

FIG. 11 is a schematic diagram of the photoresist 002 patterned according to an embodiment of the present disclosure. The patterning of the photoresist 002 may include exposing the photoresist 002 using UV through a halftone mask, and developing the exposed photoresist to obtain a first photoresist pattern 003 and a second photoresist pattern 004. The halftone mask may include a light transmissive region, a semi-transmissive region, and an opaque region. After the photoresist 002 is exposed through the halftone mask using UV and the exposed photoresist is developed, the photoresist corresponding to the light-transmitting region is completely removed, the photoresist corresponding to the semi-transmissive region is partially removed to form the first photoresist pattern 003, and the photoresist corresponding to the opaque region remains to form the second photoresist pattern 004, such that the thickness of the first photoresist pattern 003 is smaller than that of the second photoresist pattern 004.

In sub-step 6024, the semiconductor film is etched using the first photoresist pattern and the second photoresist pattern as a mask.

Figure 12:
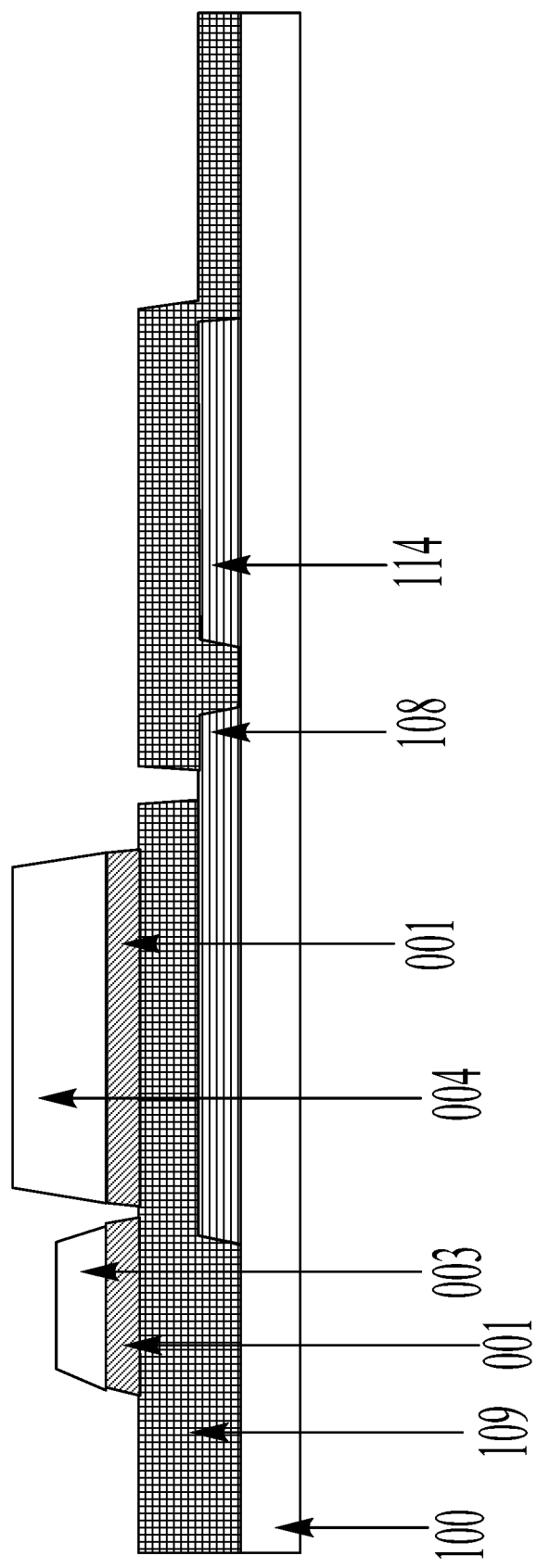
FIG. 12 is a schematic diagram of a semiconductor film etched according to an embodiment of the present disclosure.

FIG. 12 is a schematic diagram of the semiconductor film 001 etched according to an embodiment of the present disclosure. Optionally, the first photoresist pattern 003 and the second photoresist pattern 004 are used as a mask to wet etch the semiconductor film 001 to remove portions of the semiconductor film 001 that are not covered by the first photoresist pattern 003 and the second photoresist pattern 004.

In sub-step 6025, the first photoresist pattern is removed and the second photoresist pattern is thinned.

The first photoresist pattern 003 and the second photoresist pattern 004 may be ashed to remove the first photoresist pattern 003 and thin the second photoresist pattern 004.

In sub-step 6026, a portion of the etched semiconductor film that is not covered by the second photoresist pattern is conductorized to obtain the conductive pattern.

Figure 13:
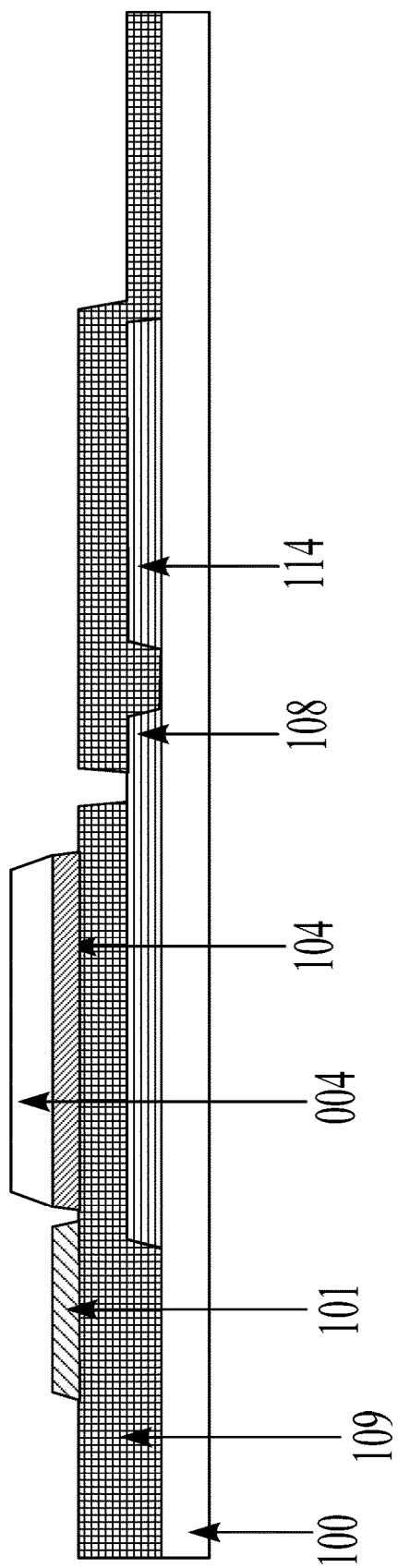
FIG. 13 is a schematic diagram of a semiconductor film conductorized according to an embodiment of the present disclosure.

FIG. 13 is a schematic diagram of a portion of the semiconductor film 001 that is not covered by the second photoresist, pattern 004 after being conductorized according to an embodiment of the present disclosure. Optionally, the region of the etched semiconductor film that is not covered by the second photoresist pattern 004 may be ion-doped by a conductorizing process such as a chemical vapor deposition process or a dry etching process to obtain the conductive pattern 101.

In sub-step 6027, the second photoresist pattern is removed to obtain the active layer pattern.

Figure 14:
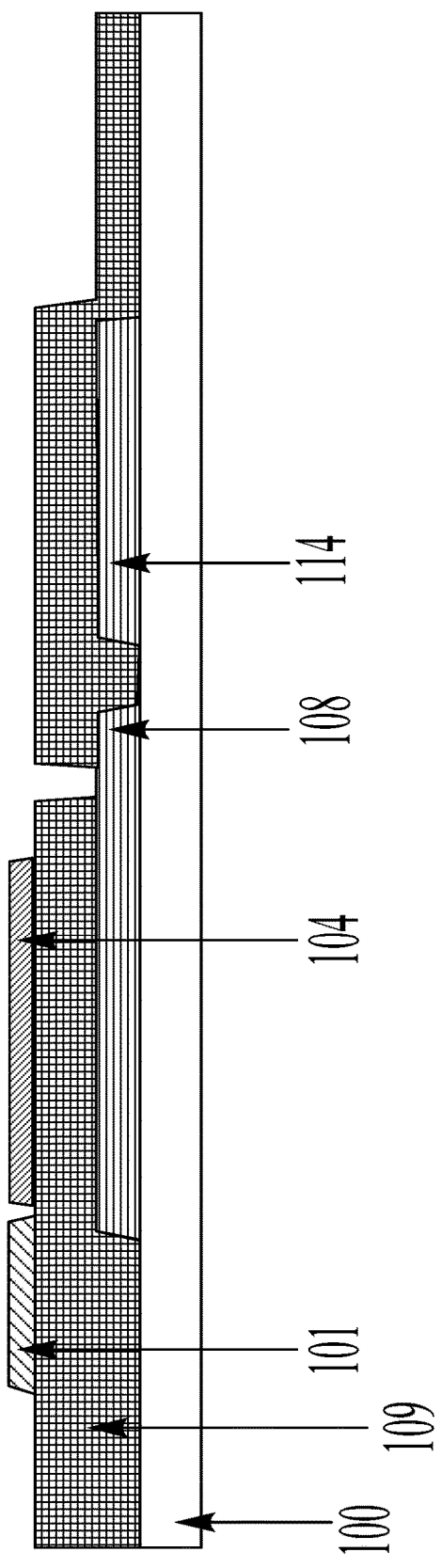
FIG. 14 is a schematic diagram of a second photoresist pattern removed according to an embodiment of the present disclosure.

FIG. 14 is a schematic diagram of a second photoresist pattern 004 removed according to an embodiment of the present disclosure. The second photoresist pattern 004 may be removed by a photoresist stripping process or an asking process, etc., to obtain the active layer pattern 104. As shown in FIG. 14, the active layer pattern 104 is distributed in the same layer as the conductive pattern 101. The active layer pattern 104 and the conductive pattern 101 are not in direct contact. The orthographic projection of the light-shielding pattern 108 on the base substrate 100 covers the orthographic projection of the active layer pattern 104 on the base substrate 100.

In step 603, a second insulating layer and a gate pattern are formed on a side of the active layer pattern distal from the base substrate.

Figure 15:
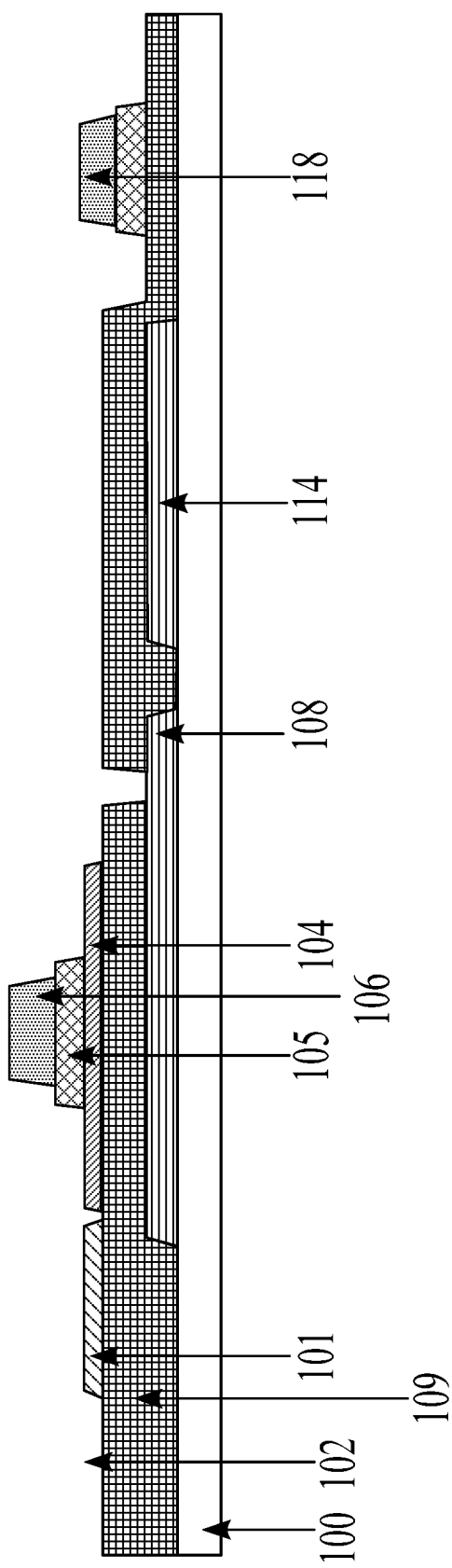
FIG. 15 is a schematic diagram of a second insulating layer and a gate pattern formed on a side of an active layer pattern distal from a base substrate according to an embodiment of the present disclosure.

FIG. 15 is a schematic diagram of a second insulating layer 105 and a gate pattern 106 formed on a side of the active layer pattern 104 distal from the base substrate 100 according to an embodiment of the present disclosure. In the process of forming the gate pattern 106, a second signal trace 118 distributed in the same layer as the gate pattern 106 may also be formed. The second insulating layer 105 may be made from silica, and the gate pattern 106 may be made from copper or aluminum.

Optionally, first, an insulating film and a metal film are sequentially deposited on a side of the active layer pattern 104 distal from the base substrate 100. Then, a photoresist is coated on the metal film, and the photoresist is sequentially exposed and developed t to obtain a photoresist pattern. Then a portion of the metal film that is not covered by the photoresist pattern is etched by a wet etching process to expose the insulating film. Then a portion of the insulating film that is not covered by the photoresist pattern is etched by a dry etching process. Finally, the photoresist pattern is stripped to obtain the second insulating layer 105, the gate pattern 106, and the second signal trace 118. The second insulating layer 105 may be a gate insulating layer. The second signal trace 118 may be a peripheral trace of the display substrate, and is disposed in a peripheral area of the display substrate. For example, the second signal trace 118 may be a ground line of the display substrate.

In step 604, a first insulating layer is formed on a side of the gate pattern distal from the base substrate. The first insulating layer has a plurality of first via holes, a second via hole, and a third via hole. The third via hole on the first insulating layer is communicated with the third via hole on the buffer layer.

Figure 16:
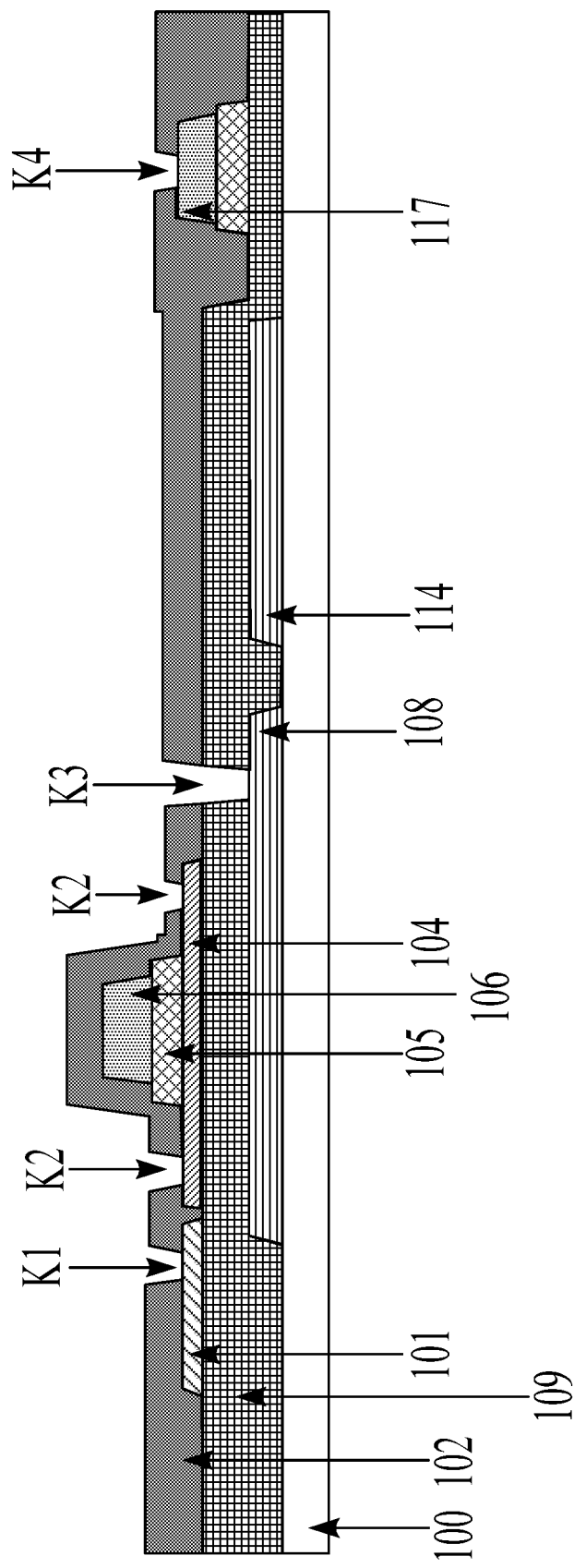
FIG. 16 is a schematic diagram of a first insulating layer formed on a side of a gate pattern distal from a base substrate according to an embodiment of the present disclosure.

FIG. 16 is a schematic diagram of a first insulating layer 102 formed on a side of the gate pattern 106 distal from the base substrate 100 according to an embodiment of the present disclosure. Optionally, the first insulating layer 102 may be formed on a side of the gate pattern 106 distal from the base substrate 100 by one-time patterning process. The first insulating layer 102 has a plurality of first via holes K1 (only shown in FIG. 16), a second via hole K2 and a third via hole K3, and further has a fourth via hole K4. The third via hole K3 on the first insulating layer 102 is communicated with the third via hole on the buffer layer 103. The signal line 101 of the conductive layer is exposed through the first via hole K1. The active layer pattern 104 is exposed through the second via hole K2. The light-shielding pattern 108 is exposed through the third via hole K3. The second signal trace 118 is exposed through the fourth via hole K4. The first insulating layer 102 may be an ILD layer. The first insulating layer 102 may be made from silica.

In step 605, a conductive layer is formed on a side of the first insulating layer distal from the base substrate. The conductive layer includes a signal line, a source-drain pattern and a second electrode plate. The signal line is electrically connected to the conductive pattern through the plurality of first via holes. The source-drain pattern is electrically connected to the active layer pattern through the second via hole. The source-drain pattern is electrically connected to the light-shielding pattern through the connected third via hole.

Figure 17:
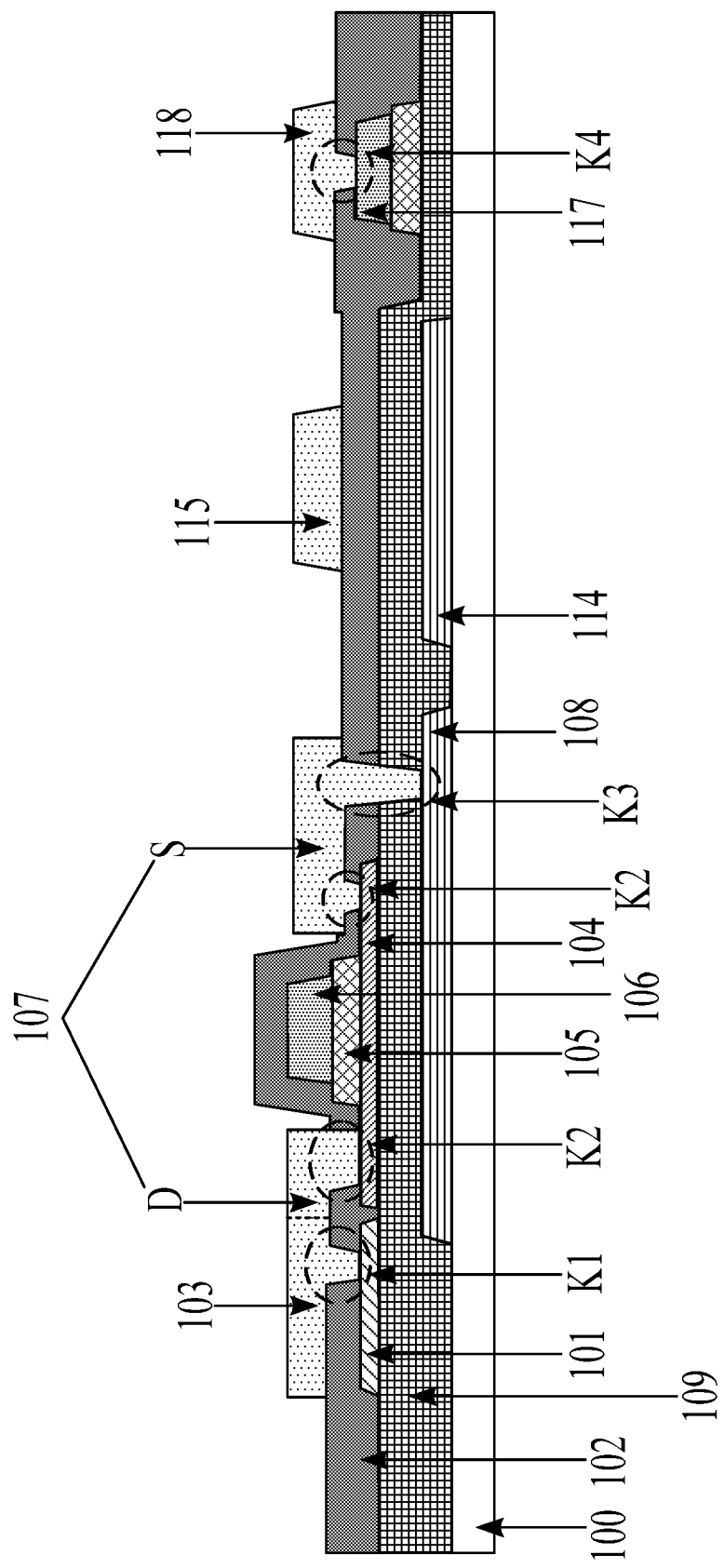
FIG. 17 is a schematic diagram of a conductive layer formed on a side of a first insulating layer distal from a base substrate according to an embodiment of the present disclosure.

FIG. 17 is a schematic diagram of a conductive layer formed on a side of the first insulating layer 102 distal from the base substrate 100 according to an embodiment of the present disclosure. Optionally, a conductive layer may be formed on a side of the first insulating layer 102 distal from the base substrate 100 through one-time patterning process. The conductive layer may include a signal line 103, a source-drain pattern 107, and a second electrode plate 115. The conductive layer may include a first signal trace 117. The signal line 103 is connected to the source-drain pattern 107. The signal line 103 is connected to the conductive pattern 101 through the plurality of first via holes K1. The source-drain pattern 107 is electrically connected to the active layer pattern 104 through the second via hole K2. The source-drain pattern 107 is electrically connected to the light-shielding pattern 108 through the third via hole K3. The first signal trace 117 is electrically connected to the second signal trace 118 through the fourth via hole K4. Since the signal line 103 is connected to the conductive pattern 101 through the first via holes K1, the signal line 103 is connected in parallel to the conductive pattern 101. The conductive pattern 101 may reduce the resistance of the signal line 103, which improves the display effect of the display device. Since the source-drain pattern 107 is electrically connected to the light-shielding pattern 108 through the third via hole K3, the source-drain pattern 107 is connected in parallel to the light-shielding pattern 108. The light-shielding pattern 108 may reduce the resistance of the source-drain pattern 107 to improve the display effect of the display device.

In step 606, a passivation layer, a color film layer, a planar layer and an electrode layer are sequentially formed on a side of the conductive layer distal from the base substrate. The electrode layer includes an electrode pattern and a third electrode plate. The passivation layer and the planar layer each have a communicated electrode via hole through which the electrode pattern is electrically connected to the source-drain pattern.

Schematically, referring to FIG. 2, a passivation layer 110, a color film layer 111, a planar layer 112, and an electrode layer are sequentially formed on a side of the conductive layer distal from the base substrate 100. Optionally, first, a layer of passivation material (for example, silicon nitride) is deposited as the passivation layer 110 on a side of the conductive layer distal from the base substrate 100; then a red color film R, a green color film G, and a blue color film B are formed on a side of the passivation layer 110 distal from the base substrate 100 by three-time patterning processes to obtain the color film layer 111; and afterwards, a resin material is deposited as the planar layer 112 on a side of the color film layer 111 distal from the base substrate 100. Thereafter, a communicated electrode via hole is formed on the planar layer 112 and the passivation layer 110 by a photolithography process. Finally, an electrode layer is formed on a side of the planar layer 112 distal from the base substrate 100 by one-time patterning process. The electrode layer may include an electrode pattern 113 and a third electrode plate 116. The electrode pattern 113 may be a pixel electrode. The third electrode plate 116, the second electrode plate 114, and the first electrode plate 114 constitute a storage capacitor.

In the embodiment of the present disclosure, the one-time patterning process may include steps of film layer deposition, photoresist coating, exposure, development, etching, photoresist stripping, etc. The photolithography process may include steps associated with the photoresist in the one-time patterning process. For example, the photolithography process may include steps of photoresist coating, exposure, development, etching, photoresist stripping, etc.

It may be understood that the sequence of the steps of the method for manufacturing a display substrate according to an embodiment of the present disclosure may be appropriately adjusted, and the steps may also be correspondingly increased or decreased according to the situation. Methods that may be easily conceived by those skilled in the art familiar with this technical field within the technical scope of the present disclosure are included in the scope of protection of the present disclosure, and therefore is not described again.

In summary, an embodiment of the present disclosure provides a method for manufacturing a display substrate. In the display substrate manufactured by the method, the signal line of the conductive layer is electrically connected to the conductive pattern through the plurality of first via holes on the first insulating layer. Therefore, if a portion of the signal line between two first via holes is broken, the signal in the signal line may be transmitted to the pixel unit across the broken portion through the conductive pattern between the two first via holes, thereby achieving efficient transmission of the signal and ensuring the display effect of the display device. In the method for manufacturing a display substrate according to an embodiment of the present disclosure, since the conductive pattern and the active layer pattern are formed by the same process, the manufacturing process of the display substrate may be simplified.

Based on the same inventive concept, an embodiment of the present disclosure provides a display device, which may include a display substrate as shown in any of FIGS. 1 to 3. The display device may be any product or component having a display function such as a liquid crystal panel, an OLED panel, an electronic paper, a mobile phone, a tablet computer, a television, a display, a notebook computer, a digital photo frame, a navigator or a wearable device.

In the present disclosure, the term "electrically connected" refers to being connected and being capable of transmitting an electrical signal, but is not intended to limit the need for electrical signal transmission. For example, "A is electrically connected to B" refers to the scenario where A is connected to B and an electrical signal may be transmitted between A and B, but there is no need to have an electrical signal transmission between A and B. The terms "first," "second," "third," and "fourth" are used herein for descriptive purposes only, and are not to be construed as indicating or implying relative importance. The term "plurality" refers to two or more, unless specifically defined otherwise.

In the present disclosure, the thickness refers to a dimension in a direction perpendicular to the plane of the base substrate. For example, the thickness of the photoresist pattern refers to a dimension of the photoresist pattern in a direction perpendicular to the base substrate.

Described above are only exemplary embodiments of the present disclosure, and are not intended to limit the present disclosure. Within the spirit and principles of the present disclosure, any modifications, equivalent substitutions, improvements and the like are within the protection scope of the present disclosure.

The invention claimed is:

1. A display substrate, comprising:
a base substrate;
a conductive pattern, a first insulating layer, and a conductive layer laminated on the base substrate, wherein the first insulating layer has a plurality of first via holes, and the conductive layer comprises a signal line electrically connected to the conductive pattern through the plurality of first via holes; and
an active layer pattern, wherein the conductive pattern is distributed in a same layer as the active layer pattern and is not in direct contact with the active layer pattern.

2. The display substrate of claim 1, wherein
an overlap exists between an orthographic projection of the signal line on the base substrate and an orthographic projection of the conductive pattern on the base substrate.

3. The display substrate of claim 2, wherein
the conductive pattern is a strip-shaped pattern, and a lengthwise direction of the conductive pattern is parallel to a lengthwise direction of the signal line.

4. The display substrate of claim 1, further comprising:
a second insulating layer and a gate pattern, wherein the active layer pattern, the second insulating layer, the gate pattern, the first insulating layer and the conductive layer are sequentially distributed in a direction distal from the base substrate, the conductive layer further comprises a source-drain pattern, and the first insulating layer further has a second via hole, the source-drain pattern being electrically connected to the active layer pattern through the second via hole.

5. The display substrate of claim 4, further comprising:
a light-shielding layer disposed on a side of the active layer pattern proximal to the base substrate, and a buffer layer disposed between the light-shielding layer and the active layer pattern, wherein the light-shielding layer comprises a light-shielding pattern, and an orthographic projection of the light-shielding pattern on the base substrate covers the orthographic projection of the active layer pattern on the base substrate; and the first insulating layer and the buffer layer each have a third via hole, the third via hole on the first insulating layer being communicated with the third via hole on the buffer layer, and the source-drain pattern being electrically connected to the light-shielding pattern through the communicated third via holes.

6. The display substrate of claim 5, further comprising:
a passivation layer, a color film layer, a planar layer, and an electrode layer sequentially laminated on a side of the conductive layer distal from the base substrate, wherein the electrode layer comprises an electrode pattern, and the passivation layer and the planar layer each have a communicated electrode via hole, the electrode pattern being electrically connected to the source-drain pattern through the electrode via holes;
wherein the light-shielding layer further comprises a first electrode plate, the conductive layer further comprises a second electrode plate, and the electrode layer further comprises a third electrode plate, the first electrode plate, the second electrode plate and the third electrode plate constituting a storage capacitor.

7. The display substrate of claim 1, further comprising:
a second insulating layer and a source-drain pattern, wherein the active layer pattern, the first insulating layer, the conductive layer, the second insulating layer and the source-drain pattern are sequentially distributed in a direction distal from the base substrate, the conductive layer further comprises a gate pattern, the second insulating layer has a second via hole, and the source-drain pattern is electrically connected to the active layer pattern through the second via hole.

8. The display substrate of claim 7, further comprising:
a light-shielding layer disposed on a side of the active layer pattern proximal to the base substrate, and a buffer layer disposed between the light-shielding layer and the active layer pattern, wherein the light-shielding layer comprises a light-shielding pattern, and an orthographic projection of the light-shielding pattern on the base substrate covers the orthographic projection of the active layer pattern on the base substrate;
wherein the second insulating layer and the buffer layer each have a third via hole, the third via hole on the second insulating layer being communicated with the third via hole on the buffer layer, and the source-drain pattern being electrically connected to the light-shielding pattern through the communicated third via holes.

9. The display substrate of claim 8, further comprising:
a passivation layer, a color film layer, a planar layer, and an electrode layer sequentially laminated on a side of the conductive layer distal from the base substrate, wherein the electrode layer comprises an electrode pattern, and the passivation layer and the planar layer each have a communicated electrode via hole, the electrode pattern being electrically connected to the source-drain pattern through the electrode via holes;
wherein the light-shielding layer further comprises a first electrode plate, the display substrate further comprises a second electrode plate, and the electrode layer further comprises a third electrode plate, the first electrode plate, the second electrode plate and the third electrode plate constituting a storage capacitor.

10. A method for manufacturing a display substrate, comprising:
forming a conductive pattern, a first insulating layer, a conductive layer and an active layer pattern laminated on a base substrate, wherein the first insulating layer has a plurality of first via holes, and the conductive layer comprises a signal line, the signal line being electrically connected to the conductive pattern passing through the plurality of first via holes; the conductive pattern is distributed in a same layer as the active layer pattern and is not in direct contact with the active layer pattern.

11. The method of claim 10, wherein
the conductive pattern is a strip-shaped pattern, and a lengthwise direction of the conductive pattern is parallel to a lengthwise direction of the signal line.

12. The method of claim 10, wherein
forming the conductive pattern and the active layer pattern on the base substrate comprises:
depositing a semiconductor film on the base substrate;
coating a photoresist on a side of the semiconductor film distal from the base substrate;
patterning the photoresist to obtain a first photoresist pattern and a second photoresist pattern, the first photoresist pattern having a thickness smaller than a thickness of the second photoresist pattern;
etching the semiconductor film with the first photoresist pattern and the second photoresist pattern as a mask;
removing the first photoresist pattern and thinning the second photoresist pattern;
conductorizing a portion of the semiconductor film after etching that is not covered by the second photoresist pattern to obtain the conductive pattern; and
removing the second photoresist pattern to obtain the active layer pattern.

13. The method of claim 12, wherein the removing the first photoresist pattern and thinning the second photoresist pattern comprises:
ashing the first photoresist pattern and the second photoresist pattern to remove the first photoresist pattern and thin the second photoresist pattern.

14. The method of claim 12, wherein the performing conducting treatment on a portion of the semiconductor film after etching that is not covered by the second photoresist pattern to obtain the conductive pattern comprises:
performing ion doping on a portion of the semiconductor film after etching that is not covered by the second photoresist pattern to obtain the conductive pattern.

15. The method of claim 12, wherein the patterning the photoresist comprises:
exposing the photoresist with a halftone mask; and
developing the exposed photoresist.

16. The method of claim 12, wherein
prior to the forming an active layer pattern on the base substrate, the method further comprises:
sequentially forming a light-shielding layer and a buffer layer on the base substrate, wherein the light-shielding layer comprises a light-shielding pattern and a first electrode plate, and the buffer layer has a third via hole;
the forming an active layer pattern on the base substrate comprises:
forming an active layer pattern on a side of the buffer layer distal from the base substrate, wherein an orthographic projection of the light-shielding pattern on the base substrate covers an orthographic projection of the active layer pattern on the base substrate;
upon the forming an active layer pattern on a side of the buffer layer distal from the base substrate, the method further comprises:
forming a second insulating layer and a gate pattern on a side of the active layer pattern distal from the base substrate;
the forming a first insulating layer and a conductive layer on the base substrate comprises:
sequentially forming the first insulating layer and the conductive layer on a side of the gate pattern distal from the base substrate, wherein the conductive layer further comprises a source-drain pattern and a second electrode plate, and the first insulating layer further has a second via hole and a third via hole, the third via hole on the first insulating layer being communicated with the third via hole on the buffer layer, the source-drain pattern being electrically connected to the active layer pattern through the second via hole, and the source-drain pattern being electrically connected to the light-shielding pattern through the communicated third via holes; and
upon the sequentially forming the first insulating layer and the conductive layer on a side of the gate pattern distal from the base substrate, the method further comprises:
sequentially forming a passivation layer, a color film layer, a planar layer and an electrode layer on a side of the conductive layer distal from the base substrate, wherein the electrode layer comprises an electrode pattern and a third electrode plate, and the passivation layer and the planar layer each have a communicated electrode via hole, the electrode pattern being electrically connected to the source-drain pattern through the electrode via holes; and
wherein the first electrode plate, the second electrode plate and the third electrode plate constitute a storage capacitor.

17. The method of claim 12, wherein
prior to the forming an active layer pattern on the base substrate, the method further comprises:
sequentially forming a light-shielding layer and a buffer layer on the base substrate, wherein the light-shielding layer comprises a light-shielding pattern and a first electrode plate, and the buffer layer has a third via hole;
the forming an active layer pattern on the base substrate comprises:
forming an active layer pattern on a side of the buffer layer distal from the base substrate, wherein an orthographic projection of the light-shielding pattern on the base substrate covers an orthographic projection of the active layer pattern on the base substrate;
the forming a first insulating layer and a conductive layer on the base substrate comprises:
sequentially forming the first insulating layer and the conductive layer on a side of the active layer pattern distal from the base substrate, wherein the conductive layer further comprises a gate pattern;
upon the sequentially forming the first insulating layer and the conductive layer on a side of the active layer pattern distal from the base substrate, the method further comprises:
forming a second insulating layer and a source-drain pattern on a side of the conductive layer distal from the base substrate, and a second electrode plate distributed in the same layer as the source-drain pattern, wherein the second insulating layer has a second via hole and a third via hole, the third via hole on the second insulating layer being communicated with the third via hole on the buffer layer, the source-drain pattern being electrically connected to the active layer pattern through the second via hole, and the source-drain pattern being electrically connected to the light-shielding pattern through the communicated third via holes; and sequentially forming a passivation layer, a color film layer, a planar layer and an electrode layer on a side of the source-drain pattern distal from the base substrate, wherein the electrode layer comprises an electrode pattern and a third electrode plate, and the passivation layer and the planar layer each have a communicated electrode via hole, the electrode pattern being electrically connected to the source-drain pattern through the electrode via holes;

wherein the first electrode plate, the second electrode plate and the third electrode plate constitute a storage capacitor.

18. A display device, comprising a display substrate, wherein the display substrate comprises:

a base substrate;

a conductive pattern, a first insulating layer, and a conductive layer laminated on the base substrate, wherein the first insulating layer has a plurality of first via holes, and the conductive layer comprises a signal line, the signal line being electrically connected to the conductive pattern through the plurality of first via holes; and an active layer pattern, wherein the conductive pattern is distributed in a same layer as the active layer pattern and is not in direct contact with the active layer pattern.

\* \* \* \* \*